United States Patent
Han et al.

(10) Patent No.: US 6,676,728 B2
(45) Date of Patent: Jan. 13, 2004

(54) SPUTTERING TARGET, METHOD OF MAKING SAME, AND HIGH-MELTING METAL POWDER MATERIAL

(75) Inventors: Gang Han, Yasugi (JP); Hideo Murata, Tottori-ken (JP); Hideki Nakamura, Yasugi (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 10/224,402

(22) Filed: Aug. 21, 2002

(65) Prior Publication Data

US 2003/0019326 A1 Jan. 30, 2003

Related U.S. Application Data

(63) Continuation of application No. 09/612,561, filed on Jul. 7, 2001.

(30) Foreign Application Priority Data

Jul. 7, 1999 (JP) .......................................... 11-192994

(51) Int. Cl.⁷ ................................................ C22B 9/00
(52) U.S. Cl. ............................ 75/346; 419/30; 419/48; 419/49
(58) Field of Search ...................... 75/342, 346, 10.19; 419/30, 48, 49

(56) References Cited

U.S. PATENT DOCUMENTS

| | | |
|---|---|---|
| 3,932,760 A | 1/1976 | Inoue |
| 3,974,245 A | 8/1976 | Cheney et al. |
| 4,731,111 A | 3/1988 | Kopatz et al. |
| 4,778,517 A | 10/1988 | Kopatz et al. |
| 4,793,969 A | 12/1988 | Johnson et al. |
| 4,802,915 A | 2/1989 | Kopatz et al. |
| 4,808,217 A | 2/1989 | Kopatz et al. |
| 4,859,237 A | 8/1989 | Johnson et al. |
| 5,095,189 A | 3/1992 | Frind et al. |
| 5,124,091 A | 6/1992 | Paliwal et al. |
| 5,160,534 A | 11/1992 | Hiraki |
| 5,176,810 A | 1/1993 | Volotinen et al. |
| 5,278,384 A | 1/1994 | Matsuzawa et al. |
| 5,336,378 A | 8/1994 | Nishimura et al. |
| 5,972,065 A | 10/1999 | Dunn et al. |
| 6,036,741 A | 3/2000 | Shindo et al. |

FOREIGN PATENT DOCUMENTS

| | | |
|---|---|---|
| JP | 58-221201 | 12/1983 |
| JP | 63-250401 | 10/1988 |
| JP | 4-350106 | 12/1992 |

OTHER PUBLICATIONS

Patent Abstracts of Japan 58–221201.
Patent Abstracts of Japan 62–250401.
Patent Abstracts of Japan 4–350106.

*Primary Examiner*—Ngoclan Mai
(74) *Attorney, Agent, or Firm*—Sughrue Mion, PLLC

(57) ABSTRACT

There is provided a method of making a high-melting metal powder which has high purity and excellent formability and, particularly, of a metal powder of spherical particles made of Ta, Ru, etc. having a higher melting point than iron. There is also provided a target of high-melting metal or its alloy, which is made by the sintering under pressure of these powders and which has high purity and a low oxygen concentration and shows high density and a fine and uniform structure. A powder metal material mainly composed of a high-melting metal material is introduced into a thermal plasma into which hydrogen gas has been introduced, thereby to accomplish refining and spheroidizing. Further, an obtained powder is pressed under pressure by hot isostatic pressing, etc.

7 Claims, 3 Drawing Sheets

RAW MATERIAL POWDER

SPECIMEN 3

RAW MATERIAL POWDER

SPECIMEN 6

SPUTTERING TARGET, METHOD OF MAKING SAME, AND HIGH-MELTING METAL POWDER MATERIAL

CROSS REFERENCE TO RELATED APPLICATIONS

This is a continuation of application Ser. No. 09/612,561 filed Jul. 7, 2001, the disclosure of which is incorporated herein by reference.

BACKGROUND OF THE INVENTION

The present invention relates to a sputtering target comprising a refractory metal material, such as Ta and Ru, particularly for use in the manufacture of semiconductor LSIs and a method of making the sputtering target.

Conventionally, Al and Al alloys have been used as wiring materials for semiconductor LSIs. However, with the recent high integration design, minute design and high-speed design of operation of LSIs, it has been examined to use Cu which has higher electromigration (EM) resistance and higher stress migration (SM) resistance and provides low electric resistance. However, Cu readily diffuses into the $SiO_2$ of interlayer dielectric film and also into an Si substrate and, therefore, it is necessary to enclose Cu wiring with a diffusion barrier layer. As the barrier materials for Cu, a TaN film formed by performing reactive sputtering in an atmosphere of argon and nitrogen through the use of a Ta sputtering target and a Ta—X—N film formed by performing reactive sputtering through the use of a Ta—X alloy target are considered good. For this reason, Ta and Ta—X alloy sputtering targets for barrier metal application for semiconductor LSIs have been developed.

On the other hand, in a DRAM and FeRAM of semiconductor memory, a Pt film formed by the sputtering of a Pt target has so far been used as a capacitor electrode. However, with further large capacity design, it is being examined to use an Ru film formed by performing the sputtering of an Ru target as a capacitor electrode.

In the manufacture of targets of the above high-melting metals or their alloys (Ta, Ta alloys, Ru, etc.), any one of a melting-plastic working process and a powder sintering process can be selected, while the powder sintering process is most suited. Reasons for this are described below.

First, although the hot plastic working of Ta is possible, it is very difficult to make crystal grains uniform and fine. According to results of an investigation performed by the present inventors, coarsened crystal grains of a target are one of the major causes of generation of particles during sputtering. Recently, addition of a third alloying element to Ta—N has been proposed in order to improve the barrier property of a Ta—N film. Si and B are mentioned as such alloying elements and it is said that a Ta—X—N film formed by the reactive sputtering of a Ta—X target (X: alloying element such as Si and B) becomes amorphous, thereby improving the barrier property. However, a Ta—X alloy target raises a problem that plastic working is impossible due to the segregation by solidification and the formation of intermetallic compounds.

On the other hand, in the case of Ru, manufacture by plastic working is impossible because this metal does not have plastic workability. Therefore, it can be said that the superiority of the powder sintering process, including an advantage of yield improvement in the near-net-shape manufacture of targets, is clear as a method of making high-melting metal targets of Ta, Ta—X alloys and Ru.

Incidentally, with the recent high integration design of LSIs and minute design of devices, requirements for a reduction of impurities in materials for thin films have become very severe. In particular, for transition metals (Fe, Ni, Cr, etc.) and alkali metals (Na, K, etc.) which are considered to have a great adverse effect on the performance of devices, it is required to reduce such impurities to the order of ppb, and for radioactive elements (Th, U, etc.) to the order of ppt. Furthermore, for other low-melting metal impurities also, it is required to lower their concentrations and, as a result, it is necessary to increase purity to not less than 99.999%. In addition, in order to improve the thermal stability of barrier films, the interface electric characteristic of DRAM capacitor electrode films, etc., it is also required to lower oxygen concentrations to not more than 100 ppm.

Ta powders that can be industrially supplied are conventionally obtained by an ingot crushing process after performing the EB melting of a low-purity Ta raw material, and their purity is only a level of 4N at the most. On the other hand, the following method, for example, is adopted as a process for industrially making Ru. Caustic potash and potassium nitrate are added to crude Ru, thereby converting Ru into soluble potassium ruthenate. This salt is extracted in water and is heated during chlorine gas injection under the formation of $RuO_4$, which is then collected in dilute hydrochloric acid containing methyl alcohol. This liquid is evaporated and dried, and is then calcined in an oxygen atmosphere to form $RuO_2$, with the result that Ru metal is finally obtained by reduction under heating in hydrogen. Commercial Ru powders made by this method contained low-melting metal impurities, alkali metals, and residues of halogen elements such as Cl and hence could not meet the purity required of capacitor electrode films. Moreover, powders made by this method were coral-like porous agglomerates and had very low packing densities in the case of sintering.

In order to increase the purity of Ta and Ru targets, there have been proposed methods of refining the above raw material by EB melting, more concretely, a method which involves plastic working of an Ta ingot obtained by the EB melting and a method of machining an Ru ingot obtained by the EB melting into a target in a casting condition thereof. For example, JP-A-3-197940 discloses a method of plastically working an Ta ingot obtained by EB-melting. Also, JP-A-6-264232 discloses a method of performing plastic working and heat treatment of Ta after the EB melting thereof. Further, JP-A-11-61392 discloses a method of machining an ingot obtained by the EB melting of an Ru raw material and using it in a casting condition thereof.

High purity may be realized by using the methods disclosed in the above literature. In those cases, however, as mentioned above, there is a fear of causing a coarse or nonuniform of the microstructure at the stage of plastic working of an ingot. Further, with a material in a casting condition, the presence of a large number of pores and casting defects cannot be neglected. In addition, in the melting methods, it is impossible to perform near-net-shape forming and the yield of noble metals is low. In other words, it can be said that the melting methods proposed in the above literature are an unavoidable choice because high purity and low oxygen concentrations could not be realized in the powder sintering method.

In general, it is difficult to sinter the refractory metals (more concretely, metals each having a melting point higher than that of iron) to high density in order to increase the density of a sintered compact, pressure sintering is one of effective methods. Because metal powders are filled into a capsule and then the capsule with packing powders is sintered, the packing condition of a raw material powder is an important factor. In hot isostatic press (HIP), increasing the packing density accelerates an increase in the density of a sintered compact and reduces abnormal shrinkage during sintering and sinter cracks, resulting in an increase in yield. In other words, in performing sintering under pressure, packing a raw material powder at a high density and uniform packing bear an important meaning. It is well known that the spheroidizing treatment of a raw material powder is effective in realizing such high packing density and uniform packing. However, in case of using a crushed Ta powder and a coral-like Ta powder, the packing density is low and, therefore, the optimization (spheroidizing) of these powder shapes is also an important problem in the sintering technology of targets.

As a method for realizing the spheroidizing of a high-melting metal powder, JP-A-3-173704 discloses a method of producing a spherical Ta powder by Plasma Rotating Electrode Process (PREP) treatment, i.e., by bringing a thermal plasma into contact with a rotating electrode and thereby causing an electrode material to melt and splash. Under this method, however, the thermal plasma is given with the purpose of only spheroidizing performed by heating and melting, and the effect of purification of powder cannot be expected.

SUMMARY OF THE INVENTION

Therefore, an object of the invention is to provide a method of making a high-melting metal powder which has high purity and which is excellent in compacting and sintering, and particularly a method of making a spherical powder made of Ta, Ru, etc. having a higher melting point than that of iron. Another object of the invention is to provide a target made of high-melting metals or its alloy, which is producted by sintering these powders under pressure and which has high purity and low oxygen concentrations and besides shows high density and a fine and uniform micro-structure.

In order to attain the above objects, the present inventors have conducted research energetically and found out that by applying thermal plasma treatment to a raw material powder, it is possible to spheroidize a high-melting metal powder and, at the same time, to obtain high purity and low oxygen concentrations. Further, the inventors have found out that by performing sintering under pressure through the use of this powder which is spherical and has high purity and a low oxygen concentration, it is possible to increase packing density, with the result that it is possible to obtain a sintered powder compact suitable for sputtering targets, which has high purity and a low oxygen concentration and besides shows a high density and a uniform and fine micro-structure.

In the method of making a target according to the invention, by introducing a powder mainly composed of a high-melting metal into a thermal plasma flame, refining and spheroidizing are performed and an obtained powder is sintered under pressure. As a result of this process, it is possible to obtain a sputtering target which has high purity and a low oxygen concentration and besides shows high density and a uniform and fine micro-structure.

Further, in the method of making a target according to the invention, a powder is introduced into a thermal plasma into which hydrogen gas has been introduced. As a result of this process, it is possible to obtain a sputtering target having chemical composition which has high purity and a low oxygen concentration and besides shows high density and a uniform and fine micro-structure.

Also, in the method of making a target according to the invention, the sintering under pressure is hot isostatic pressing. As a result of this process, it is possible to obtain a sputtering target which shows high density and a uniform and fine micro-structure.

The sputtering target according to the invention comprises a sintered powder compact with a relative density of not less than 99%, a purity of not less than 99.999% and an oxygen concentration of not more than 100 ppm. As a result of this matter, a thin film obtained by sputtering through the use of this target has high purity and is uniform so as to improve the reliability of products.

Also, the sputtering target according to the invention is obtained by performing the sintering under pressure of a powder obtained by introducing a powder material mainly composed of a high-melting metal into a thermal plasma. As a result of this process, a thin film obtained by performing sputtering through the use of this target has high purity and is uniform, improving the reliability of products.

Also, the sputtering target according to the invention is obtained by introducing a powder into a thermal plasma into which hydrogen gas has been introduced. As a result of this, a thin film obtained by performing sputtering through the use of this target has high purity and is uniform so as to improve the reliability of products.

Also, in the sputtering target according to the invention, the shape of particles of the powder introduced for sintering under pressure is spherical or analogous to a sphere. As a result of this, the target shows high density and a uniform and fine micro-structure, and the uniformity of a thin film obtained by performing sputtering through the use of this target increases.

Further, in the sputtering target according to the invention, the above high-melting metal material is Ta. As a result of this matter, it is possible to obtain a Ta target which has high purity and a low oxygen concentration and shows high density and a uniform and fine micro-structure, and by using this Ta target, it is possible to obtain a Ta thin film which has high purity and is uniform.

Further, in the sputtering target according to the invention, the above high-melting metal is Ru. As a result of this matter, it is possible to obtain an Ru target which has high purity and a low oxygen concentration and shows high density and a uniform and fine micro-structure, and by using this Ru target, it is possible to obtain an Ru thin film which has high purity and is uniform.

Further, the high-melting metal powder according to the invention has a purity of not less than 99.999% and an oxygen concentration of not more than 100 ppm and the shape of particles of the high-melting metal powder is spherical or analogous to a sphere. By performing pressure sintering with the use of this powder, the packing density of the powder increases and it is possible to obtain a formed powder compact which shows high density and a uniform and fine micro-structure.

Further, the high-melting metal powder material according to the invention is obtained by introducing a powder mainly composed of a high-melting metal into a thermal plasma. As a result of this process, the obtained high-melting metal powder becomes a powder of spherical particles which has high purity and a low oxygen concentration as a chemical composition, and by performing pressure sintering through the use of this powder, it is possible to obtain a formed powder compact which has high purity and a low oxygen concentration and besides shows high density and a uniform and fine micro-structure.

Further, the high-melting metal powder according to the invention is obtained by introducing a powder into a thermal plasma into which hydrogen gas has been introduced. As a result of this process, the obtained high-melting metal powder material becomes a powder of spherical particles which has high purity and a low oxygen concentration, and by performing pressure forming through the use of this powder, it is possible to obtain a formed powder compact which has high purity and a low oxygen concentration and besides shows high density and a uniform and fine micro-structure.

As mentioned above, the greatest feature of the invention resides in the fact that a powder mainly composed of a metallic material with a higher melting point than iron, particularly Ta or Ru, is introduced into a thermal plasma, thereby to obtain a high-melting metal powder material which has high purity and a low oxygen concentration and the shape of whose particles is spherical or analogous to a sphere. When a radio-frequency (RF) thermal plasma is specifically selected from among thermal plasmas and used as a heat source, the range of the thermal plasma widens and it is possible to suppress the contact of the powder with other substances during treatment. This is most favorable for obtaining high purity.

Further, by introducing hydrogen into a thermal plasma gas, it is possible to remarkably improve the evaporation of impurities and the effect of the reduction of oxygen owing to the generation of ions and excited atoms of hydrogen.

DETAILED DESCRIPTION OF THE PREFERRED EMBODIMENTS

Figure 1:
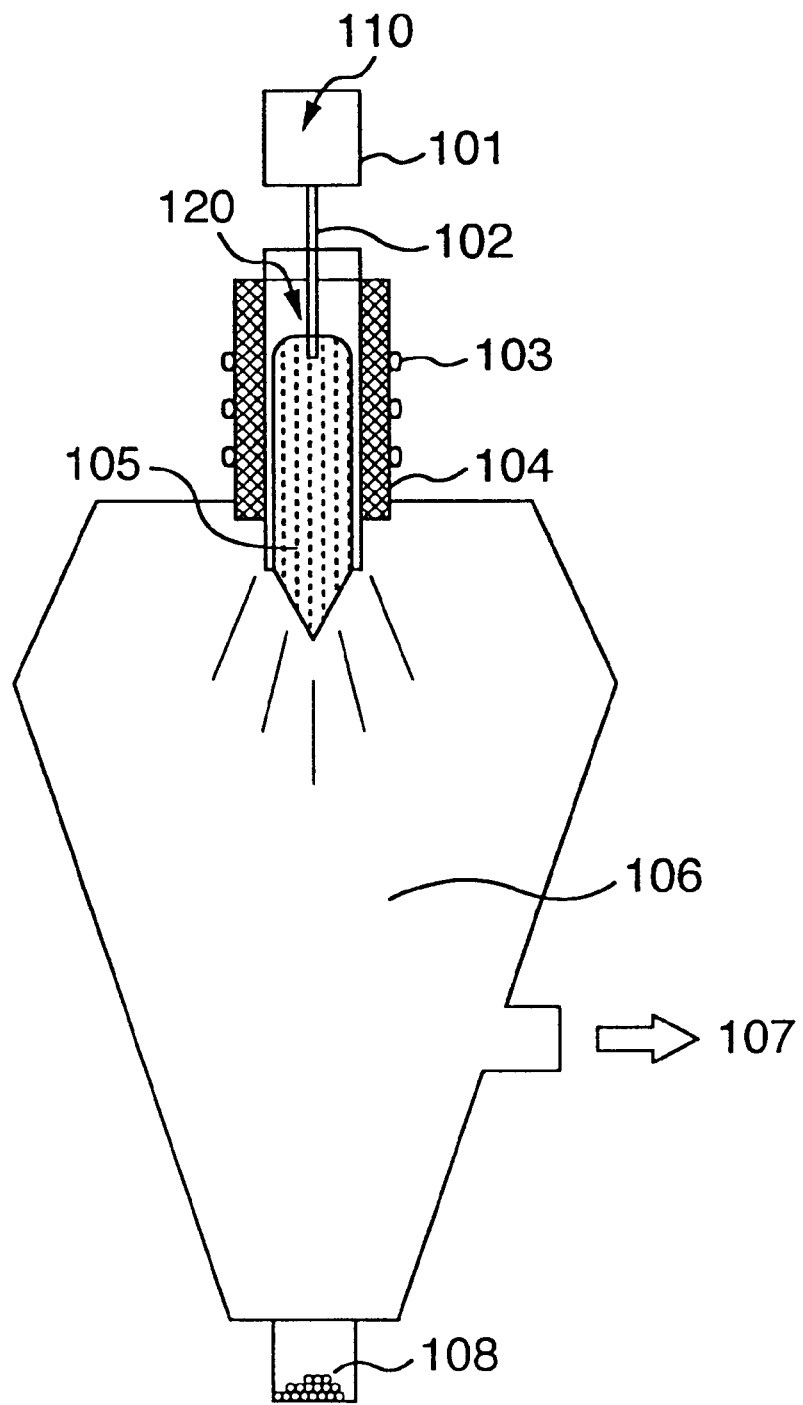
FIG. 1 is a schematic view of the structure of a thermal plasma treatment apparatus used in the invention.

Embodiments of the invention will be described below. With reference to an apparatus shown in FIG. 1, a procedure for performing the thermal plasma treatment of a powder will be explained through the use of the above thermal plasma treatment apparatus for powder treatment.

1. A raw material powder (110) is charged into an electromagnetic powder feeder (hereinafter referred to simply as a powder feeder) and a thermal plasma generator comprising a thermal plasma torch (not shown in the figure) and a chamber (106) is evacuated to a vacuum of up to 10-3 Pa.
3. The raw material powder (110) is introduced by transportation on a carrier gas from the powder feeder (101) via a nozzle (102) into the plasma high-temperature zone (105) having a temperature between 5,000 to 10,000° K. At this time, the raw material powder (110) is melted and becomes spherical due to the action of the surface tension of the liquid phase of the metal.
5. After the completion of the treatment, the plasma gas (120) and power source are stopped and powder after the treatment is recovered from a powder recovery can (108). It is possible to perform the recovery both in a protective gas and in the air.

In the thermal plasma high-temperature zone (102), the raw material powder (110) is melted and becomes spherical due to the action of the surface tension of the metal, and as a result of this process, the shape of the powder particles after the treatment becomes spherical.

Further, oxides and low-melting impurities contained in the raw material powder (110) evaporate in the thermal plasma high-temperature zone (105) because their vapor pressures are higher than those of Ta and Ru. As a result of this condition, the purity of the raw material powder (110) increases and, at the same time, its oxygen concentration decreases. However, the pressure of the plasma gas used here is almost atmospheric pressure and hence the effect of the evaporation of impurities is not great with an argon thermal plasma treatment alone. In such cases, if hydrogen is introduced thereinto, it is possible to further lower the oxygen concentration by the reduction reaction of hydrogen ions, excited atoms, etc. In the invention also, the introduction of hydrogen gas enables the effect of the evaporation of impurities to be remarkably improved.

Hot pressing or hot isostatic pressing (HIP) is performed through the use of a high-melting metal powder obtained in the manner shown above. In HIP, in particular, a powder is packed in a capsule made of carbon steel on the bottom of which a piece of Mo foil is laid, and HIP is performed after deaeration and sealing in a vacuum. It is desirable that this powder be sintered under pressure at a temperature of not less than 1100° C. and at a pressure of not less than 50 MPa. Next, the above sintered powder compact is subjected to machining or surface grinding and is bonded to a packing plate, thereby to complete a target.

In conventional powders, the shrinkage during sintering was great because of their low packing densities and it was necessary to consider extra thicknesses and diameters in order to ensure target sizes. In addition, yields were low because of abnormal shrinkage and sintering cracks. It has become apparent that, in contrast to this matter, by improving packing density through the use of a powder of spherical particles obtained with the aid of a thermal plasma as mentioned above, for example, in a case where a target with a size of 350 to 400 mm in diameter×10 mm in thickness is to be made, it is possible to reduce powder consumption by 10 to 30% in comparison with conventional powders.

EXAMPLE 1

Figure 2A:
FIGS. 2A and 2B are micrographs obtained by a scanning electron microscope for showing changes in the shape of Ta powder particles before and after the thermal plasma treatment.
Figure 2B:
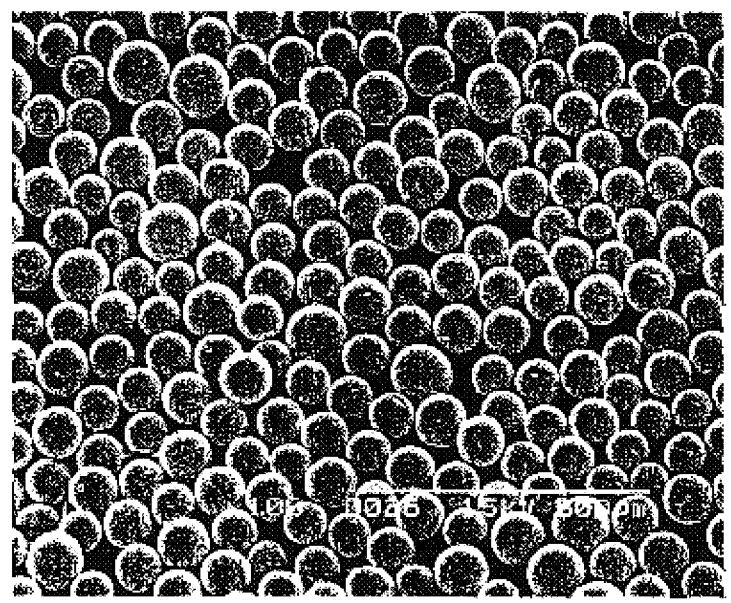

Examples of the invention will be explained below. The treatment of Ta powders was actually carried out through the use of an apparatus of the structure shown in FIG. 1. The Ta raw material powders used in the treatment and thermal plasma treatment conditions are shown in Table 1. Further, with respect to changes in the shape of powder particles before and after the thermal plasma treatment, micrographs of Specimen 3, as an example, obtained by a scanning electron microscope are shown in FIGS. 2A and 2B. FIG. 2A is a photograph of a raw material powder (before the thermal plasma treatment) and FIG. 2B is a photograph of Specimen 3 (after thermal plasma treatment).

Next, the powder after the thermal plasma treatment was packed in an HIP can and the packing density at that time was measured. The result of the measurement is shown in Table 1. Further, a Ta target with a size of 350 mm in diameter×10 mm in thickness was fabricated from the powder of spherical particles under the sintering conditions of 1350° C.–155 MPa–1 hour. The packing density was measured, and the result of the measurement is also shown in Table 1.

Further, an impurity analysis of the sintered Ta compact was made with the aid of a GD-MS (glow discharge-mass spectrometer). The result of the analysis is shown in Table 2. Incidentally, in order to make clear the effects of the thermal plasma treatment on the packing density and chemical composition of the sintered powder compact, the same measurements as mentioned above were carried out also for the raw material powder not subjected to the thermal plasma treatment, and the results of these measurements are also shown in Tables 1 and 2.

The results of the above examination will be looked over. First, it is apparent from Table 1 that each of Specimens 1 to 3 subjected to the thermal plasma treatment, has a packing density of not less than 60% in an HIP can and a sintering density of almost 100%, both showing a substantial increase in comparison with the raw material powder that is a comparative example. This is because, as shown in FIGS. 2A and 2B, the shape of powder particles became spherical due to the thermal plasma treatment.

As made clear from the result shown in Table 2, the purity of Ta is increased from a level of 3N to levels of 4N and 5N by the thermal plasma treatment. From the foregoing it has become apparent that a Ta target obtained from a Ta powder subjected to the thermal plasma treatment by pressure sintering is most suited to the formation of a TaN film by reactive sputtering.

EXAMPLE 2

Figure 3A:
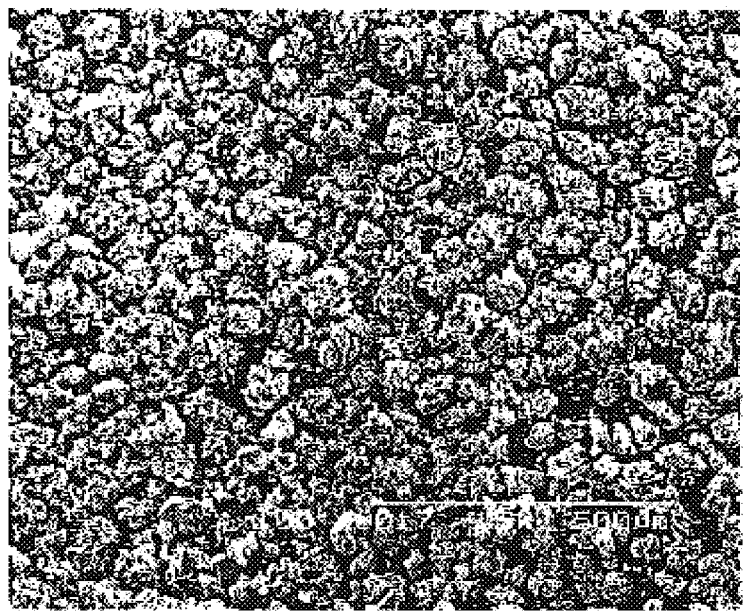
FIGS. 3A and 3B are micrographs obtained by a scanning electron microscope for showing changes in the shape of Ru powder particles before and after the thermal plasma treatment.
Figure 3B:
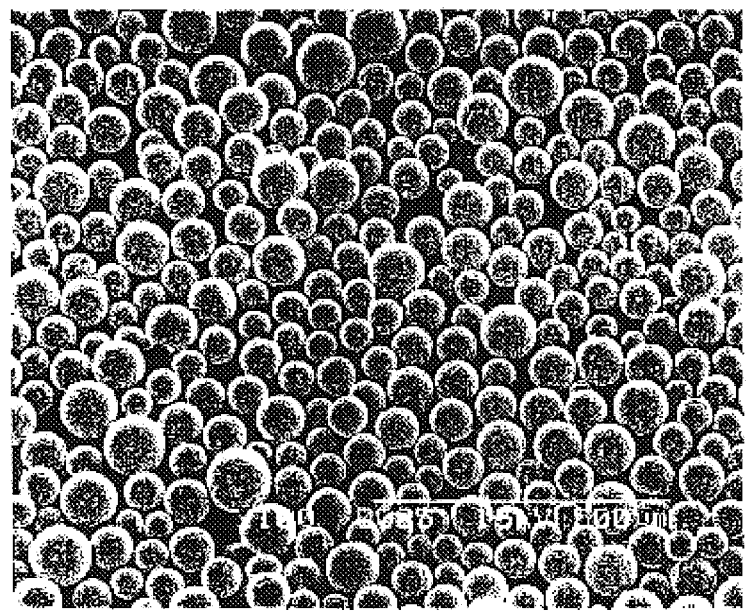

Chemically processed powder Ru was examined in the same manner as with Example 1. The Ru raw material powders and thermal plasma treatment conditions as well as measurement results of HIP can packing density and sintering density are shown in Table 3. Further, with respect to changes in the shape of powder particles before and after the thermal plasma treatment, micrographs of Specimen 6, as an example, obtained by a scanning electron microscope are shown in FIGS. 3A and 3B. FIG. 3A is a photograph of a raw material powder (before the thermal plasma treatment) and FIG. 3B is a photograph of Specimen 6 (after thermal plasma treatment). Further, an Ru target with a size of 400 mm in diameter×10 mm in thickness was fabricated from the powder of spherical particles. An impurity analysis of the Ru target after sintering was made, and the result of the analysis is shown in Table 4.

From the results shown in Table 3, it is apparent that each of Specimens 4 to 6 subjected to the thermal plasma treatment, has an HIP can packing density of not less than 60% and a sintering density of almost 100%, both showing a substantial increase in comparison with the raw material powder that is a comparative example. This is because, as shown in FIGS. 3A and 3B, the shape of powder particles became spherical due to the thermal plasma treatment.

From the result shown in Table 4, it is apparent that the purity of Ru is increased from a level of 3N to levels of 4N and 5N by the thermal plasma treatment. From the foregoing it has become apparent that an Ru target obtained from an Ru powder subjected to the thermal plasma treatment by pressure sintering is most suited to the formation of an Ru film by sputtering.

TABLE 1

| | | Comparative example (Raw material powder) | Specimen 1 | Specimen 2 | Specimen 3 |
|---|---|---|---|---|---|
| Plasma treatment conditions | Particle size of raw material powder | 250–325 meshes | 250–325 meshes | 325–425 meshes | 250–325 meshes |
| | Plasma power | — | 45 kW | 28 kW | 40 kW |
| | Composition of plasma gas | — | Ar | Ar + 8% $H_2$ | Ar + 30% $H_2$ |
| | Flow rate of plasma gas (l/min) | — | 80 | 75 | 85 |
| | Flow rate of carrier gas (l/min) | — | 10 | 10 | 15 |
| Sintering | HIP can packing density | 46.8 | 62.5 | 63.1 | 82.7 |
| | Sintering density | 96.3 | 99.6 | 99.8 | 99.9 |

TABLE 2

| | Comparative example (Raw material powder) | Specimen 1 | Specimen 2 | Specimen 3 |
|---|---|---|---|---|
| Na | 0.785 | 0.681 | 0.008 | <0.001 |
| Mg | 0.624 | 0.411 | 0.027 | 0.018 |
| Al | 3.761 | 2.522 | 0.201 | 0.146 |
| Si | 10.192 | 7.804 | 0.603 | 0.410 |
| P | 0.220 | 0.321 | 0.227 | 0.255 |
| S | 0.591 | 0.580 | 0.041 | 0.034 |
| Cl | 2.572 | 0.726 | 0.010 | 0.005 |
| K | 3.871 | 1.073 | 0.027 | 0.001 |
| Ca | 1.442 | 0.516 | 0.013 | 0.007 |
| Ti | 4.433 | 4.162 | 0.357 | 0.041 |
| V | 0.020 | 0.021 | <0.007 | <0.004 |
| Cr | 13.644 | 11.956 | 0.976 | 0.759 |
| Mn | 0.932 | 1.033 | 0.352 | 0.366 |
| Fe | 38.431 | 37.523 | 0.970 | 0.178 |
| Co | 0.827 | 0.786 | 0.034 | 0.026 |
| Ni | 4.700 | 3.384 | 0.803 | 0.715 |
| Cu | 6.812 | 4.920 | 0.621 | 0.490 |
| Nb | 0.559 | 0.587 | 0.512 | 0.523 |
| Mo | 4.037 | 4.121 | 1.136 | 0.980 |
| Ru | 0.152 | 0.171 | 0.144 | 0.130 |
| Pb | 0.179 | 0.195 | 0.083 | 0.067 |
| In | 0.251 | 0.264 | 0.141 | 0.102 |
| Ir | 0.053 | 0.071 | 0.059 | 0.056 |
| Th | 14.930 ppb | 3.726 ppb | 27.417 ppt | 20.307 ppt |
| U | 19.465 ppb | 16.357 ppb | 53.060 ppt | 41.150 ppt |
| C | 23.716 | <20 | <10 | <10 |
| N | 1.504 | 1.316 | 0.882 | 0.627 |
| O | 1450 | 1410 | 96 | 38 |
| Purity of Ta | 99.98% | >99.99% | >99.999% | >99.999% |

Note:
Unit of impurity element concentration: (ppm)
Purity of Ta: Purity excluding gas portion (%)

TABLE 3

|  |  | Comparative example (Raw material powder) | Specimen 4 | Specimen 5 | Specimen 6 |
|---|---|---|---|---|---|
| Plasma treatment conditions | Particle size of raw material powder | 200–325 meshes | 100–250 meshes | 200–325 meshes | 200–325 meshes |
|  | Plasma power | — | 45 kW | 28 kW | 40 kW |
|  | Composition of plasma gas | — | Ar | Ar + 8% $H_2$ | Ar + 30% $H_2$ |
|  | Flow rate of plasma gas (l/min) | — | 80 | 75 | 85 |
|  | Flow rate of carrier gas (l/min) | — | 10 | 10 | 15 |
| Sintering | HIP can packing density | 33.3 | 65.2 | 66.2 | 65.8 |
|  | Sintering density | 96.7 | 99.7 | 99.9 | 99.9 |

TABLE 4

|  | Comparative example (Raw material powder) | Specimen 4 | Specimen 5 | Specimen 6 |
|---|---|---|---|---|
| Na | 2.383 | 1.904 | 0.117 | 0.024 |
| Mg | 2.300 | 1.832 | 0.213 | 0.078 |
| Al | 5.837 | 4.983 | 0.640 | 0.182 |
| Si | 3.409 | 2.114 | 0.175 | 0.100 |
| P | 0.644 | 0.563 | 0.272 | 0.061 |
| S | 0.121 | 0.101 | 0.041 | 0.080 |
| Cl | 61.504 | 6.033 | 0.780 | 0.064 |
| K | 4.370 | 1.754 | 0.061 | 0.004 |
| Ca | 1.363 | 0.712 | 0.032 | 0.002 |
| Ti | 1.156 | 0.982 | 0.084 | 0.040 |
| V | 0.121 | 0.118 | 0.087 | 0.074 |
| Cr | 0.504 | 0.511 | 0.027 | 0.018 |
| Mn | 0.123 | 0.112 | 0.063 | 0.044 |
| Fe | 6.548 | 5.861 | 0.143 | 0.110 |
| Co | 1.278 | 1.004 | 0.254 | 0.107 |
| Ni | 2.693 | 1.508 | 0.621 | 0.087 |
| Cu | 2.771 | 1.019 | 0.276 | 0.061 |
| Nb | 0.034 | 0.045 | 0.042 | 0.041 |
| Zr | 0.787 | 0.658 | 0.094 | 0.035 |
| Mo | 0.071 | 0.067 | 0.078 | 0.070 |
| Rh | 0.304 | 0.401 | 0.417 | 0.409 |
| In | 2.804 | 2.201 | 0.409 | 0.006 |
| Sn | 3.565 | 1.870 | 0.186 | 0.207 |
| Sb | 2.380 | 1.306 | 0.122 | 0.098 |
| Ta | 0.227 | 0.229 | 0.374 | 0.391 |
| W | 0.102 | 0.110 | 0.131 | 0.137 |
| Th | 77.234 ppt | 73.701 ppt | <0.010 ppt | <0.010 ppt |
| U | 385.720 ppt | 250.144 ppt | <98.289 ppt | <71.143 ppt |
| C | <2 | <2 | <2 | <12 |
| N | <0.2 | <0.2 | <0.2- | <0.2 |
| O | 1278 | 87 | 21 | <10 |
| Purity of Ru | 99.95% | >99.99% | >99.999% | >99.999% |

Note:
Unit of impurity element concentration: (ppm)
Purity of Ru: Purity excluding gas portion (%)

As mentioned above, according to the invention, by performing the thermal plasma treatment through the use of a thermal plasma into which hydrogen is introduced, an increase in purity, a decrease in oxygen concentration, and the spheroidizing of high-melting metal powder materials of Ta, Ru, etc. can be simultaneously realized. Furthermore, by performing the sintering under pressure of an obtained powder, it is possible to realize a Ta or Ru target which shows high density and a fine and uniform micro-structure and which has high purity and a low oxygen concentration and to obtain an optimum sputtered thin film.

What is claimed is:

1. A method of refining a metal powder comprising the steps of: passing a metal into a thermal plasma into which a-hydrogen gas is introduced; and refining the metal powder to have a purity of not less than 99.999% and an oxygen concentration of not more than 100 ppm.

2. A method of refining a metal powder according to claim 1, comprising passing the metal powder into a thermal plasma into which hydrogen gas is introduced, wherein the metal powder has a purity of not less than 99.9%.

3. A method of making a target comprising the steps of introducing a metal powder mainly composed of refractory metal into a thermal plasma into which hydrogen gas has been introduced, thereby to perform simultaneous refining of the metal powder and spheroidizing of the metal powder; and sintering the obtained metal powder under pressure.

4. A method of making a target according to claim 3 comprising the steps of introducing the metal powder mainly composed of refractory metal into the thermal plasma into which hydrogen gas has been introduced, thereby to perform simultaneous refining of the metal powder and spheroidizing of the metal powder; and sintering the obtained metal powder under hot isostatic pressing.

5. A method of making a target according to claim 3, comprising the steps of introducing the metal powder mainly composed of refractory metal into the thermal plasma into which hydrogen gas has been introduced, thereby to perform refining of the metal powder to a purity of not less than 99.99% and an oxygen concentration of not more than 100 ppm.

6. A method of making a target according to claim 3, comprising the steps of introducing the metal powder mainly composed of refractory metal into the thermal plasma into which hydrogen gas has been introduced, thereby to perform refining of the metal powder to a purity of not less than 99.999% and an oxygen concentration of not more than 100 ppm.

7. A method of making a target according to claim 3, comprising the steps of introducing the metal powder having a purity of not less than 99.9% mainly composed of the refractory metal into the thermal plasma into which the hydrogen gas has been introduced.

* * * * *

UNITED STATES PATENT AND TRADEMARK OFFICE
CERTIFICATE OF CORRECTION

PATENT NO.    : 6,676,728 B2
DATED         : January 13, 2004
INVENTOR(S)   : Han, Gang, Murata, Hideo and Nakamura, Hideki It is certified that error appears in the above-identified patent and that said Letters Patent is hereby corrected as shown below:

Title page,
Item [63], Related U.S. Application Data, delete "continuation of application 09/612,561, filed on July 7, 2001" and insert -- continuation of application 09/612,561, filed on July 7, 2000 --.

Signed and Sealed this

Thirteenth Day of July, 2004

JON W. DUDAS
*Acting Director of the United States Patent and Trademark Office*